United States Patent
Arranz

(10) Patent No.: US 10,347,968 B2
(45) Date of Patent: Jul. 9, 2019

(54) COMPACT MICRO BASE STATIONS IN WIRELESS NETWORKS

(71) Applicant: ZTE España. S.L.U., Madrid (ES)

(72) Inventor: Miguel Arranz, Madrid (ES)

(73) Assignee: ZTE España, S.L.U., Madrid (ES)

(*) Notice: Subject to any disclaimer, the term of this patent is extended or adjusted under 35 U.S.C. 154(b) by 543 days.

(21) Appl. No.: 14/769,357

(22) PCT Filed: Feb. 20, 2014

(86) PCT No.: PCT/EP2014/000456
§ 371 (c)(1),
(2) Date: Aug. 20, 2015

(87) PCT Pub. No.: WO2014/127916
PCT Pub. Date: Aug. 28, 2014

(65) Prior Publication Data
US 2015/0380805 A1 Dec. 31, 2015

Related U.S. Application Data

(60) Provisional application No. 61/767,055, filed on Feb. 20, 2013.

(51) Int. Cl.
H01Q 1/24 (2006.01)
H01Q 1/12 (2006.01)
(Continued)

(52) U.S. Cl.
CPC ............ *H01Q 1/24* (2013.01); *H01Q 1/1242* (2013.01); *H01Q 1/246* (2013.01);
(Continued)

(58) Field of Classification Search
CPC ...... H01Q 23/00; H01Q 1/1242; H01Q 21/00; H01Q 1/24; H01Q 1/246; H01Q 9/16;
(Continued)

(56) References Cited

U.S. PATENT DOCUMENTS 5,155,495 A * 10/1992 Hately .................. H01Q 9/28
343/725
6,222,503 B1 4/2001 Gietema et al.
(Continued)

FOREIGN PATENT DOCUMENTS

GB 2 340 513 A 2/2000
GB 2 468 730 A 9/2010
(Continued)

OTHER PUBLICATIONS

Wolfgang, Basic Array Theory, Jan. 1992, IEEE Proceedings of the IEEE, vol. 80, No. 1.*

(Continued)

*Primary Examiner* — Jessica Han
*Assistant Examiner* — Jae K Kim
(74) *Attorney, Agent, or Firm* — Perkins Coie LLP

(57) ABSTRACT

Methods, systems, and devices are disclosed for implementing a compact wireless communications base station. In one aspect, a small cell base station device configured in a street cabinet unit for wireless communication includes a radio unit and/or a baseband unit to reside within the street cabinet unit, a pole attached to the exterior of the street cabinet unit, in which the pole structured to include an orifice, an antenna attached to the pole such that the antenna is at a height above the top surface of the street cabinet unit, and a feeder cable that electrically couples the antenna to the radio unit and/or the baseband unit, the feeder cable at least partially contained within the orifice.

12 Claims, 6 Drawing Sheets

(51) Int. Cl.
*H01Q 9/16* (2006.01)
*H01Q 21/00* (2006.01)
*H05K 7/18* (2006.01)
*H01Q 9/04* (2006.01)
*H01Q 9/18* (2006.01)
*H01Q 23/00* (2006.01)

(52) U.S. Cl.
CPC ............. *H01Q 9/0464* (2013.01); *H01Q 9/16* (2013.01); *H01Q 9/18* (2013.01); *H01Q 21/00* (2013.01); *H01Q 23/00* (2013.01); *H05K 7/18* (2013.01); *H05K 7/186* (2013.01)

(58) Field of Classification Search
CPC ........ H01Q 9/18; H01Q 9/0464; H05K 7/186; H05K 7/18
See application file for complete search history.

(56) References Cited

U.S. PATENT DOCUMENTS

| | | | | |
|---|---|---|---|---|
| 9,865,931 | B1* | 1/2018 | Tonn | H01Q 13/22 |
| 2005/0036323 | A1* | 2/2005 | Baken | H01Q 1/1207 |
| | | | | 362/382 |
| 2009/0224995 | A1* | 9/2009 | Puente | H01Q 1/246 |
| | | | | 343/850 |
| 2010/0231469 | A1* | 9/2010 | Kim | H01Q 1/246 |
| | | | | 343/721 |
| 2010/0265813 | A1* | 10/2010 | Pereira | H04W 28/0231 |
| | | | | 370/201 |
| 2012/0188137 | A1* | 7/2012 | Lalezari | H01Q 9/28 |
| | | | | 343/773 |
| 2012/0319903 | A1* | 12/2012 | Huseth | G01S 3/74 |
| | | | | 342/386 |
| 2013/0187821 | A1* | 7/2013 | Lecam | H01Q 1/246 |
| | | | | 343/799 |
| 2013/0244654 | A1* | 9/2013 | Carmon | H04W 36/32 |
| | | | | 455/436 |

FOREIGN PATENT DOCUMENTS

| | | | | |
|---|---|---|---|---|
| JP | 08-316713 A | | 11/1996 | |
| JP | 2009159225 A | * | 7/2009 | |
| JP | 2009-303201 A | | 12/2009 | |
| WO | WO-9810529 A1 | * | 3/1998 | ........... G08B 25/016 |
| WO | WO-9950926 A1 | * | 10/1999 | ............... H01Q 1/12 |

OTHER PUBLICATIONS

Japanese Office Action dated Jul. 12, 2016 for Japanese Patent Application No. 2015-558373, filed on Feb. 20, 2014 (5 pages).
International Search Report and Written Opinion dated Aug. 1, 2014 for International Application No. PCT/EP2014/000456, filed Feb. 20, 2014 (8 pages).
González, M.C.R., et al., "Analysis of Conformal Antennas for Avionics Applications," Institute for Communications and Navigation, 69 pages, Jan. 2007.

* cited by examiner

Diagrama de radiación de un dipolo elemental, tridimensional y corte en el plano E

COMPACT MICRO BASE STATIONS IN WIRELESS NETWORKS

CROSS REFERENCE TO RELATED APPLICATIONS

This patent document claims the benefit of priority of U.S. Provisional Patent Application No. 61/767,055, filed on Feb. 20, 2013. The entire content of the before-mentioned patent application is incorporated by reference herein.

TECHNICAL FIELD

This patent document relates to wireless communication technologies.

BACKGROUND

A wireless communication system can include a network of base stations (or radio cells) to wirelessly communicate with one or more wireless devices or user equipment (UE) devices via radio frequency (RF) signals. Examples of UE devices include a mobile device or mobile station (MS), a wireless air card or USB device, access terminal (AT), a subscriber station (SS), a portable computer (e.g., a laptop, a netbook computer or a tablet device), and an electronic reader. Each base station can emit radio signals that carry signaling and data to UE devices via forward links (FLs) or downlinks (DLs) within a limited geographic coverage area known as a radio cell (or cell). Also, a radio cell is synonymously described as a base station throughout this patent document.

The signaling can include various control and network management signals. The data can include any or all of voice data, text data, graphic data, application data, audio data, and video data. A base station can be referred to as an access point (AP) or an access network (AN), or can be included as part of an AN. A UE device can transmit a signal on a reverse link (RL), or uplink (UL), to a base station. The wireless communication system can include one or more radio access network controllers to control one or more base stations. Examples of various wireless technologies include Long-Term Evolution (LTE), Evolved High-Speed Packet Access (HSPA+), Code division Multiple Access (CDMA) technologies (e.g., CDMA2000 1x, and High Rate Packet Data (HRPD)), Wideband CDMA (WCDMA) technologies, and WiMAX (Worldwide Interoperability for Microwave Access).

SUMMARY

Techniques, systems, and devices are disclosed for implementing a compact small cell wireless communications base station.

In one aspect of the disclosed technology, a small cell base station device configured in a street cabinet unit for wireless communication includes a radio unit and/or a baseband unit to reside within the street cabinet unit, a pole attached to the exterior of the street cabinet unit, in which the pole structured to include an orifice, an antenna attached to the pole such that the antenna is at a height above the top surface of the street cabinet unit, and a feeder cable that electrically couples the antenna to the radio unit and/or the baseband unit, the feeder cable at least partially contained within the orifice.

In another aspect, a small cell base station device for wireless communication includes a street cabinet unit including an enclosure, a radio unit and/or a baseband unit that resides within the enclosure of the street cabinet unit and configured to generate wireless communication signals, a pole attached to the exterior of the street cabinet unit, the pole structured to include an orifice, an antenna attached to the pole such that the antenna is at a height above the top surface of the street cabinet unit and configured to transmit the wireless communication signals to provide wireless service in a nearby area, and a feeder cable that electrically couples the antenna to the radio unit or the baseband unit to direct the wireless communication signals from the radio unit and/or the baseband unit to the antenna, the feeder cable at least partially contained within the orifice.

In another aspect, a method for providing a small cell base station device in an existing street cabinet includes locating an existing street cabinet including equipment utilizing electrical power, installing a small cell base station device into the existing street cabinet, in which the installing includes attaching a mast of the device to the exterior of the street cabinet such that an antenna of the device attached to the mast is raised to a height above the top surface of the street cabinet unit and connecting the device to an electrical power connection in the street cabinet, and providing electrical power to the device to enable the device to operate.

The subject matter described in this patent document can be implemented in specific ways that provide one or more of the following features. For example, in some implementations, the pole of the exemplary small cell base station device can be configured as a tubular pole. For example, the tubular pole can include a diameter in a range between 4 and 8 cm. In some implementations, the pole of the exemplary small cell base station device can include a length in a range of 3.5 m to 4 m. In some implementations, the pole of the exemplary small cell base station device can include a central hollow interior to provide the orifice. For example, the pole can be attached to the exterior of the street cabinet unit using one or more brackets. For example, the feeder cable can be configured within the orifice of the pole through an opening into the street cabinet unit, in which the opening is located under the bracket(s). In some implementations, the antenna can be configured as a cylindrical patch antenna. For example, the exemplary cylindrical patch antenna can be positioned at the highest end of the pole and separated with an electrical distance of at least $\lambda/2$, where $\lambda$ is the wavelength in the signal band of interest. In some implementations, the antenna can be configured as a dipole antenna. In some implementations, the device can be operated in a frequency range of 1.8 to 3.5 GHz.

BRIEF DESCRIPTION OF THE DRAWINGS

Like reference symbols and designations in the various drawings indicate like elements. The accompanying drawings are not necessarily drawn to scale.

DETAILED DESCRIPTION

Techniques, systems, and devices are disclosed for implementing a compact small cell wireless communications base station.

For example, implementation of the disclosed technology can provide a cost efficient deployment of small cells in urban environments that overcomes several practical obstacles currently preventing massive implementations of small cell wireless technology. In some implementations, the disclosed technology facilitates the installation of an exemplary small cell wireless communication base station through synergies with existing street cabinets, e.g., providing Fix Access services and others.

Throughout this document, the term "exemplary" is used to mean "an example of."

Figure 1:
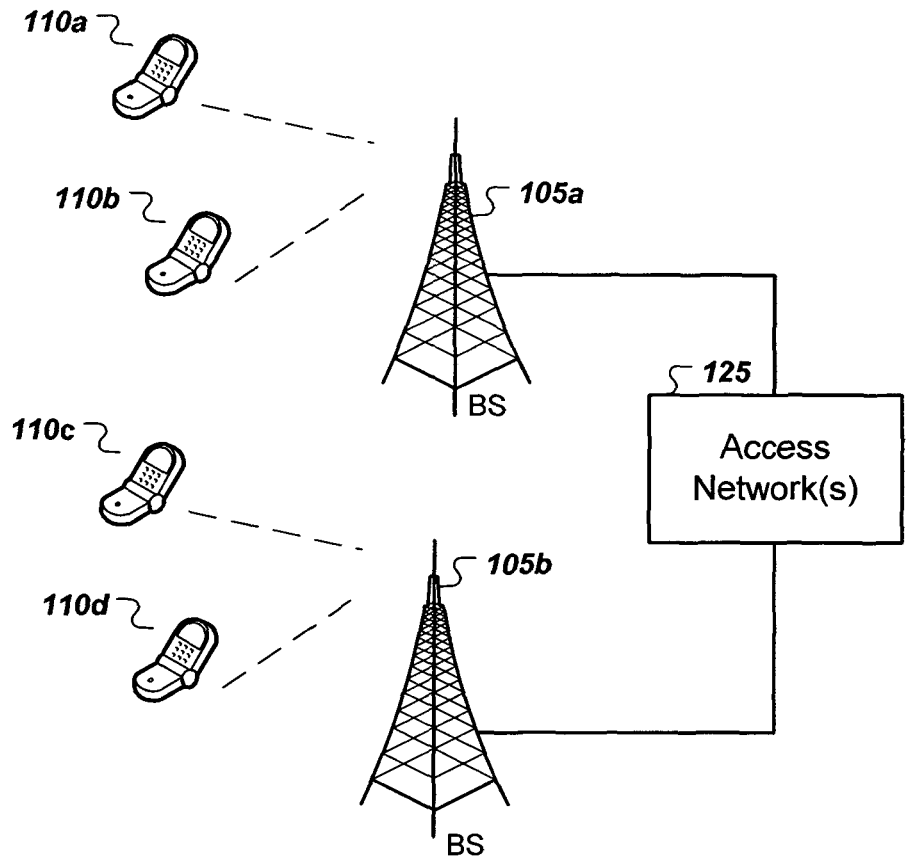
FIG. 1 shows a diagram of an exemplary wireless communication network or system.

FIG. 1 shows a diagram of an example wireless communication network or system. This wireless communication network can include one or more base stations (BSs) 105, 107 and one or more wireless devices 110. A base station 105, 107 can transmit a signal on a forward link (FL), known as a downlink (DL) signal, to one or more wireless devices 110. A wireless device 110 can transmit a signal on a reverse link (RL), known as an uplink (UL) signal, to one or more base stations 105, 107. A wireless communication system can include one or more core networks 125 to control one or more base stations 105, 107. One or more base stations form a radio access network. A base station, due to its nature of providing radio access for a wireless device, either alone or in combination with one or more other base stations, can be referred to as an access point (AP), an access network (AN) or eNodeB. Examples of wireless communication systems that can implement the present techniques, systems and devices include, among others, wireless communication systems based on Code division Multiple Access (CDMA) such as CDMA2000 1×, High Rate Packet Data (HRPD), Long-Term Evolution (LTE), Universal Terrestrial Radio Access Network (UTRAN), and Worldwide Interoperability for Microwave Access (WiMAX).

Figure 2:
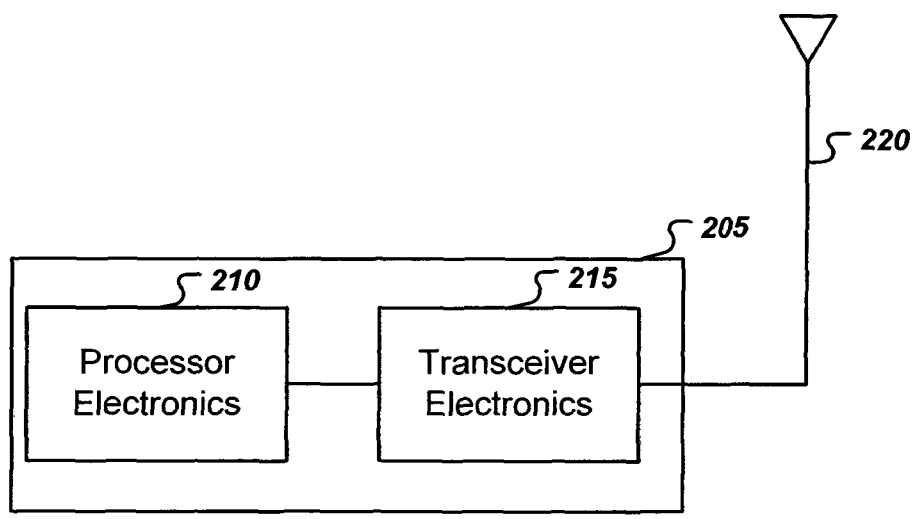
FIG. 2 shows a diagram of an exemplary radio transceiver station for implementing a wireless device, a base station or other wireless communication modules.

FIG. 2 shows an example of a radio transceiver station for implementing a wireless device, a base station or other wireless communication modules. Various examples of radio stations include base stations and wireless devices in FIG. 1. For example, a small cell base station device configured in a street cabinet unit for wireless communication as described below can implement a radio unit or a baseband unit based on the radio transceiver in FIG. 2.

Specifically in FIG. 2, a radio station 205 such as a base station or a wireless device can include processor electronics 210 such as a microprocessor that implements methods such as one or more of the techniques presented in this patent document. A radio station 205 can include transceiver electronics 215 to send and/or receive wireless signals over one or more communication interfaces such as one or more antennas 220. A radio station 205 can include other communication interfaces for transmitting and receiving data. In some implementations, a radio station 205 can include one or more wired communication interfaces to communicate with a wired network. A radio station 205 can include one or more memories 225 configured to store information such as data and/or instructions. In some implementations, processor electronics 210 can include at least a portion of transceiver electronics 215 and a memory 225.

In some implementations, radio stations 205 can communicate with each other based on a CDMA air interface. In some implementations, radio stations 205 can communicate with each other based on an orthogonal frequency-division multiplexing (OFDM) air interface which can include Orthogonal Frequency-Division Multiple Access (OFDMA) air interface. In some implementations, radio stations 205 can communicate using one or more wireless technologies such as CDMA such as CDMA2000 1×, HRPD, WiMAX, LTE, and Universal Mobile Telecommunications System (UMTS).

In some implementations, a radio station 205 may additionally be configured with a local area network connectivity such as a 802.11 (a/b/g/n) interface. The availability of such an interface may make it possible to communicatively couple the radio station 205 to the Internet via the local area connection. For example, a user may access services over her user equipment (UE) by connecting to the service via a wireless local area network connection (e.g., home Wi-Fi access) through a fixed broadband network such as a cable modem network or a DSL network or fiber network.

Figure 3:
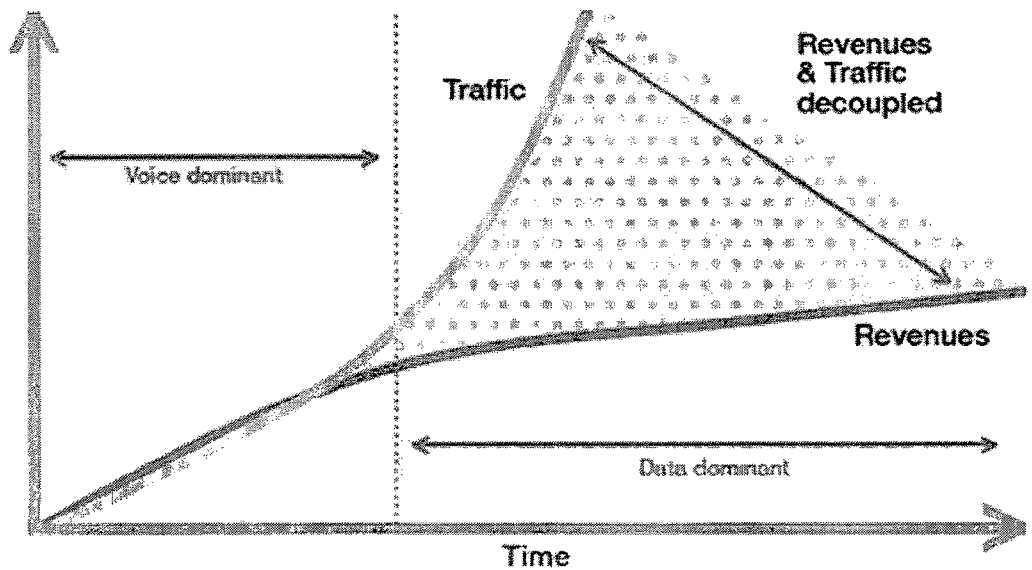
FIG. 3 shows an exemplary plot showing the decoupling growth of traffic and revenues for mobile operators.

There has been an explosion in the demand for mobile data services which is posing a large set of challenges to mobile operators to meet the demand. Mobile operators are also stressed by reduced margins that are obtained through their data offerings. In this context, the overall wireless industry is looking for technologies and solutions that, (1) are technically feasible to cater the exponential data volume growth (e.g., recent report by Cisco, Inc. forecasts a 13× data growth between 2012 and 2017); and (2) are able to reduce the cost per data unit as enabler for a healthier and workable mobile internet deployment. For example, one issue is the decoupling of revenue of data traffic from its volume, which may pose risks to the future of networks development worldwide. FIG. 3 shows an exemplary plot showing the decoupling growth of traffic and revenues for mobile operators.

Addressing these two factors has led to a large effort to discover new technologies or solutions capable of massive deployment at a reasonable cost. For example, 'small cell' wireless communication technologies have been introduced, which has recently been gaining traction from the overall industry and standardization bodies. For example, a standardization effort from the 3rd Generation Partnership Project (3GPP) has been focused on the Het Net (Heterogeneous Networks) area, which is fundamentally addressing the introduction of small cells and its interaction with macro cells.

'Small cells' are small-sized, low-powered radio access nodes that operate as cellular base stations in spectrums having a small range of 10 meters to 200 meters, e.g., which is in contrast to a mobile 'macrocell' which can have a range of a few kilometers. Small cells include femtocells, picocells, and microcells, which can be deployed to cover a limited, designated area, e.g., such as in-building areas. For example, beamforming technologies can be employed to further enhance and focus small cell coverage. Generally, small cells are centrally managed by mobile network operators. For example, small cells have been implemented by mobile operators struggling to support the growth in mobile data traffic, e.g., particularly in urban areas. Many mobile operators are using mobile data offloading as a more efficient use of radio spectrum. For example, small cells are a vital element to 3G data off-loading, and many mobile network operators see small cells as vital to managing LTE advanced spectrum more efficiently, as compared to using just macrocells.

Figure 4:
FIG. 4 shows exemplary images of existing small cell deployments in an urban area.

FIG. 4 shows exemplary images of existing small cell deployments in an urban area. In these examples, the small cell communication link is mounted to an existing telephone phone or mounted to a building.

However, there are challenges and pitfalls associated with existing small cell deployments. For example, the deployment of small cells present a remarkable set of practical implementation barriers that in some world areas, as for instance Europe, which may significantly jeopardize its true adoption. For example, some implementation barriers can include, but are not limited to:

(a) site acquisition. For example, although the space requirements of the small cell are largely reduced from the macro sites, an agreement with space owners (e.g., typically local authorities) will still be required.
(b) implementation permits. For example, permits are usually required, which involve agreements with council authorities.
(c) environmental impact. For example, implementation may include assessment of the environmental impact of the deployment. Additionally, for example, visual intrusiveness of the antennas may often be considered for the deployment.
(d) energy requirements. For example, deployment of existing small cells typically include back-up mechanisms against black outs.
(e) high capacity backhaul availability.
(f) site-by-site engineering of the solution, e.g., due to multiple urban casuistics.

Implementation barriers may result in consequences that may effectively prevent the practical and massive deployment of small cells. For example, such consequences can include high costs per small cell, e.g., which arrive at negative profitability; and large implementation time, e.g., which doesn't fulfill operator needs.

Currently, telecom operators providing Fixed Access usually enjoy a large number of assets in the form of street cabinets. These street cabinets usually allocate active and passive equipment able to provide the means for delivery of voice and data services in urban environments (e.g., such as P2P fiber, xPON, xDSL, docsys, etc.). In most cases, for example, street cabinets already have available fiber, energy, security means and regulatory permits. For example, millions of street cabinets have been deployed worldwide, e.g., particularly throughout urban environments. As an example, it is estimated that in a medium size country in Europe (e.g., around 16 million population) the incumbent fix operator manages around 4,000 street cabinets. Additionally, for example, operators usually leave in their street cabinets room for the introduction of new cards or equipment, as a forward looking caution against the never-ending evolution of the telecommunications technologies.

Figure 5A:
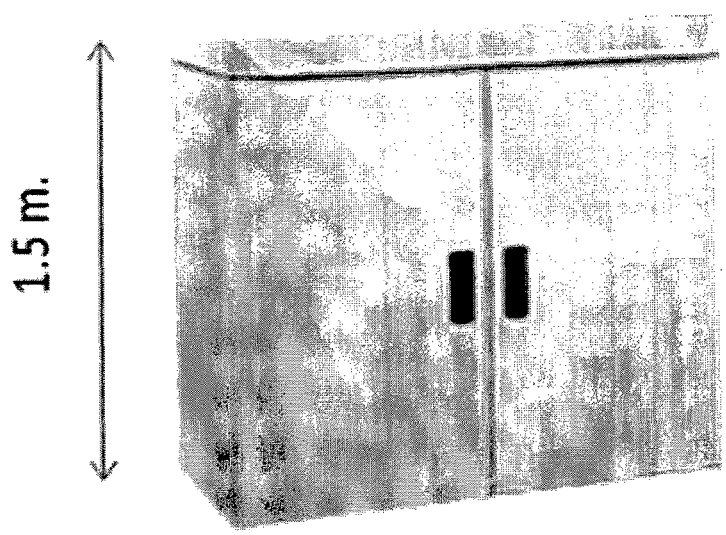
FIGS. 5A and 5B show exemplary images of existing street cabinets in urban environments.
Figure 5B:
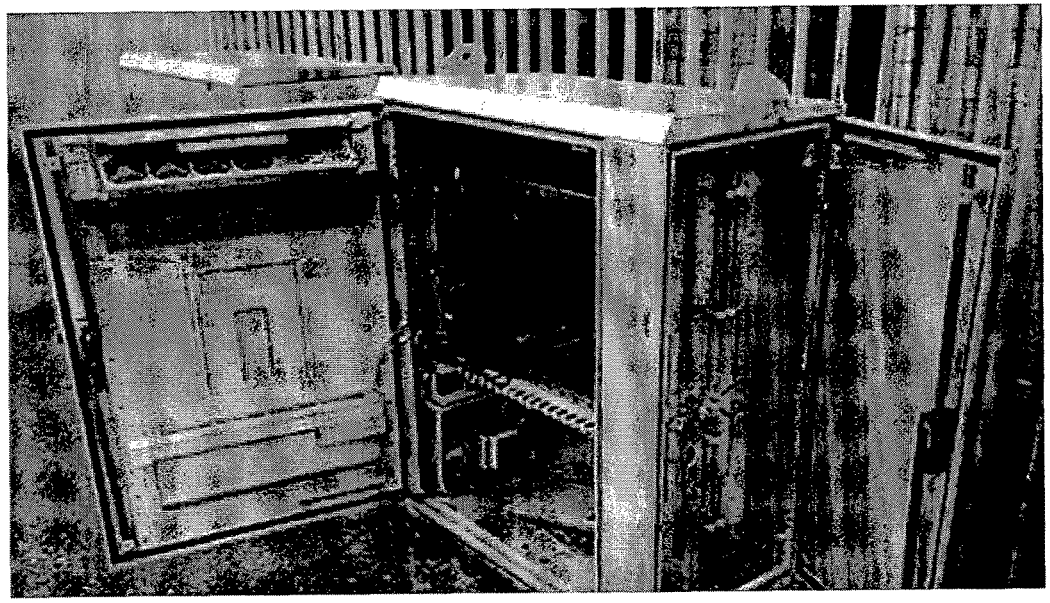

FIGS. 5A and 5B show exemplary images of existing street cabinets that provide equipment for delivery of voice and data services in urban environments. The image of FIG. 5A shows a height dimension of the exemplary street cabinet to be 1.5 m. The image of FIG. 5B shows a view of the interior of the street cabinet, e.g., including communications equipment and unused space. These exemplary existing street cabinets are not designed to facilitate small cells. For example, the case structure of the street cabinets are typically designed for the size of the current equipment that they house, e.g., which is around 1.5 meters of height. For antennas allocated in urban environments at this height level, the coverage obtained would be marginal at best, and the risk of vandalism would be high. Additionally, compliance with local regulations (e.g., with respect to health and safety) may pose complications which makes such a deployment with the existing street cabinets at severe risk.

The disclosed technology can be implemented to overcome at least some or all of the described drawbacks relating to the practical implementation of small cells in combination with street cabinets, as previously described in examples (a)-(f).

In one aspect, a small cell base station device configured in a street cabinet unit for wireless communication includes a radio unit or a baseband unit to reside within the street cabinet unit, a pole attached to the exterior of the street cabinet unit, in which the pole structured to include an orifice, an antenna attached to the pole such that the antenna is at a height above the top surface of the street cabinet unit, and a feeder cable that electrically couples the antenna to the radio unit and/or the baseband unit, the feeder cable at least partially contained within the orifice.

Figure 6:
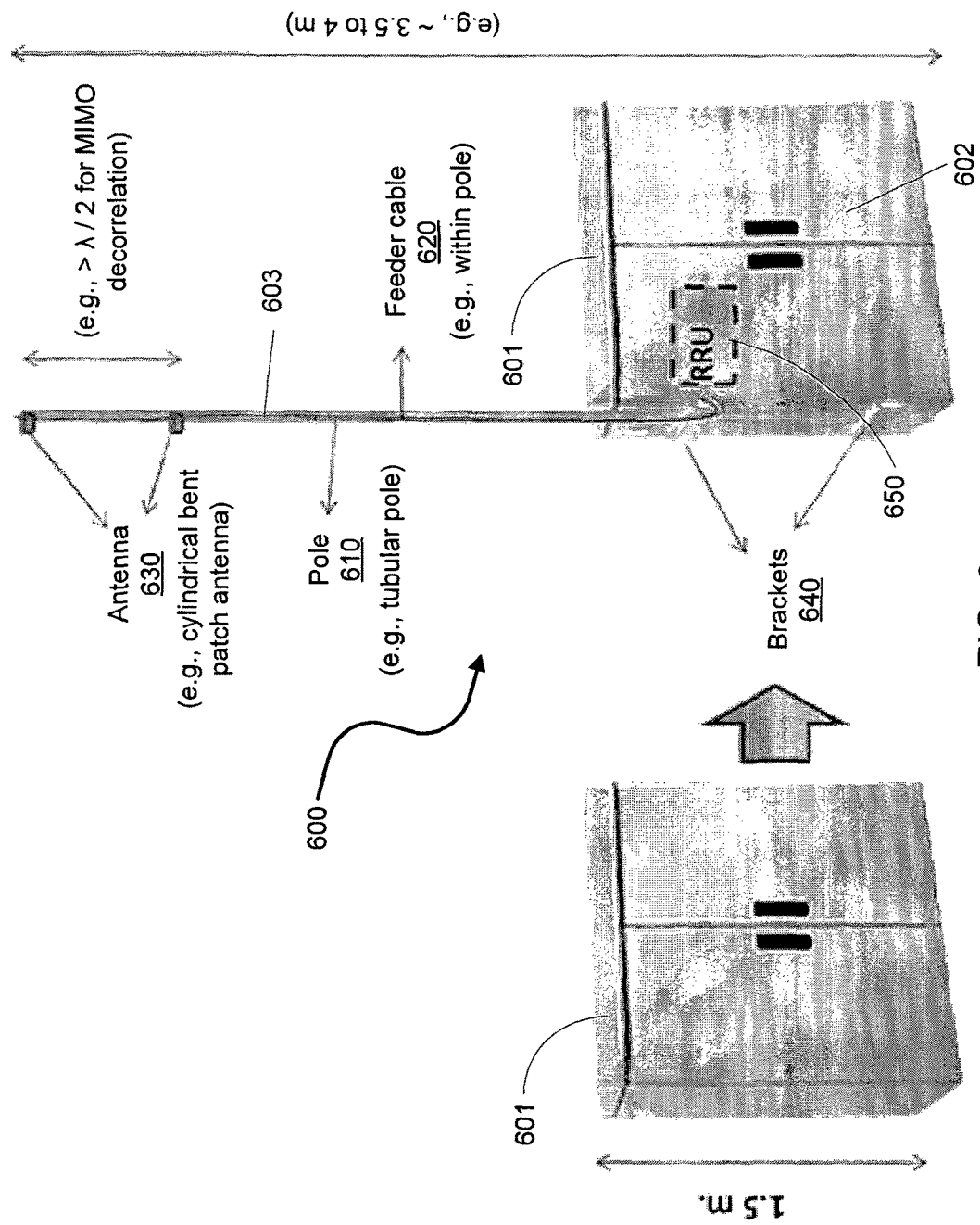
FIG. 6 shows a schematic of an exemplary small cell wireless communications base station of the disclosed technology configured in a street cabinet unit.

FIG. 6 shows a schematic of an implementation of an exemplary small cell base station device 600 of the disclosed technology configured in a street cabinet unit 601. The device 600 includes a remote radio unit (RRU) and/or a baseband unit (BU) 650 that is housed within the enclosure 602 of the street cabinet unit 601. The device 600 includes a pole 610 attached to the exterior of the street cabinet unit 601, in which the pole is structured to include an orifice 603. In some implementations, for example, the pole 610 can be attached to a side of the street cabinet unit 601 using one or more brackets 640. The device 600 includes an antenna 630 attached to the pole 610 such that the antenna 630 is positioned at a height above the top surface of the street cabinet unit 601. In some implementations, for example, the pole 610 can be configured to a length such that the antenna 630 is raised to a height in a range of 3.5 m to 4 m. The device 600 includes one or more feeder cables 620 that electrically couples the antenna 630 to the RRU and/or the BU 650 residing within the street cabinet unit 601, in which the feeder cable 620 is at least partially contained within the orifice of the pole 610.

In some implementations, the pole 610 can be configured as a tubular pole. For example, the pole 610 can include a central hollow interior to provide the orifice 603 that contains the feeder cable 620 coupling the RRU/BU 650 in the street cabinet unit 601 with the antenna 630. For example, the exemplary tubular pole 610 can include a diameter in a range between 4 and 8 cm, or, for example, other ranges, which can be based on the used band. For example, the feeder cable 620 can be configured within the orifice of the pole through an opening into the street cabinet unit 601, in which the opening is located under the bracket(s) 640. For example, existing street cabinets may already include such openings.

The disclosed small cell base station devices can utilize a variety of antenna configurations.

In some implementations, the antenna 630 can be configured as a dipole antenna. Although conventional dipole antennas can be used on the higher end of the pole 610, such existing dipole antennas may add a visual impact on the overall construction. For example, obtrusive visual impacts may result in practical resistance to acquire installation and/or operation permits and social acceptance.

Figure 7:
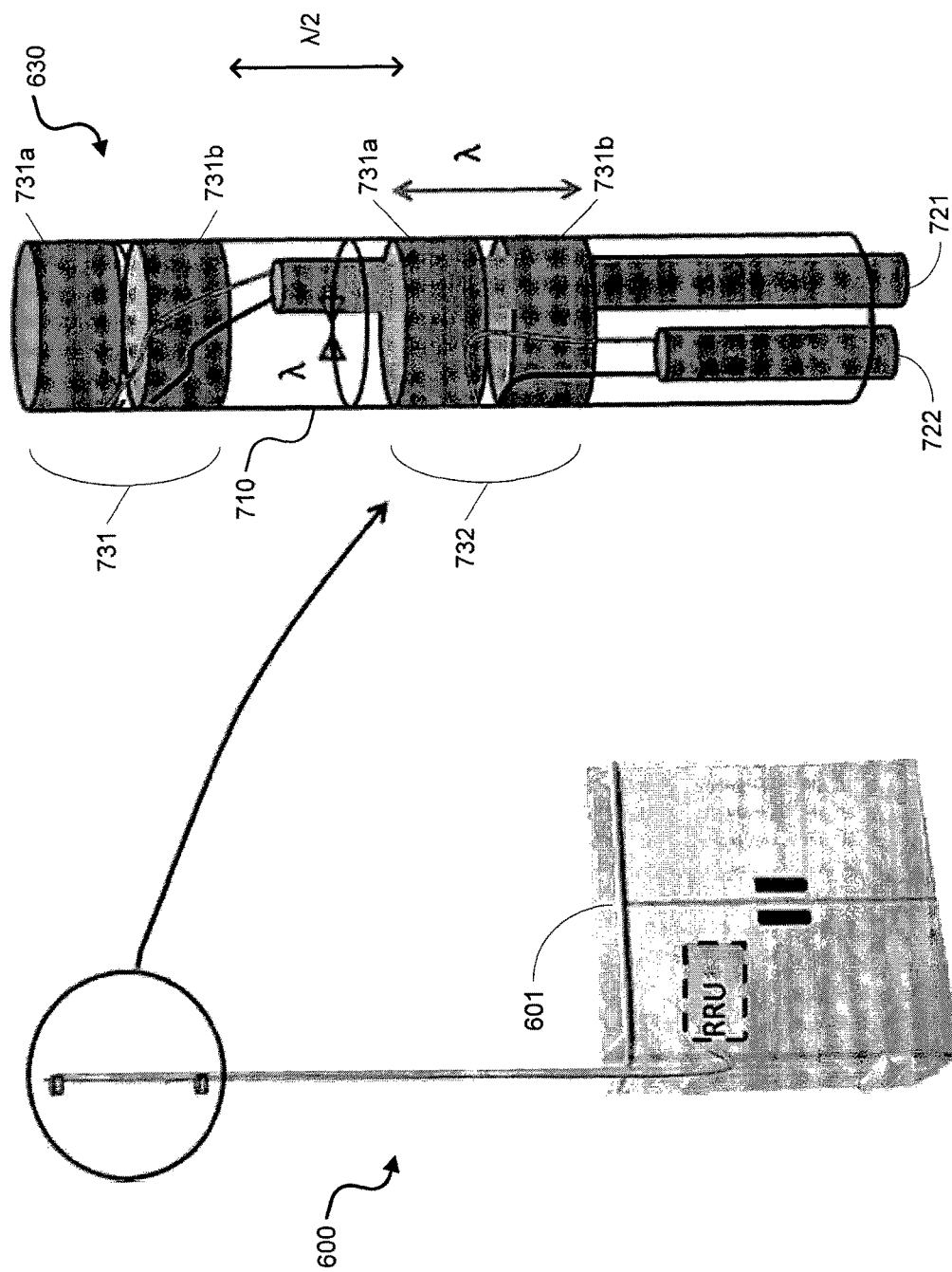
FIG. 7 shows an illustration of the exemplary cylindrically bended patch antenna including exemplary shape, dimensions and connections.

In some implementations, the antenna 630 can be configured as a cylindrical patch antenna, e.g., in which an exemplary embodiment is shown in FIG. 7. The cylindrically bended patch antenna can also referred to as circularly bended patch antennas and circularly bended textile antennas. For example, the cylindrical patch antenna can be positioned at the highest end of the pole (e.g., in a range of 3.5 m to 4 m) and separated with an electrical distance of at least 2$\lambda$. This exemplary configuration is practical for small cell frequencies, e.g., such as those within the range of 1.8 to 3.5 GHz. For example, depending on the specific band used, the exemplary circularly bended patch antenna can provide the right diagram pattern with reasonable dimensions of the patch and the radius of the pole.

The disclosed small cell base station devices can be advantageous for at least the following exemplary features. For example, site engineering for each individual small cell base station device will not be required. For example, installation for each individual small cell base station device will not require skilled workforce. For example, visual impact of a small cell base station device is negligible or substantially minimized, e.g., particularly through the employment of cylindrically bended antennas.

The disclosed small cell base station devices can be referred to as a "hot street cabinet", e.g., as it is capable of providing capacity relied mechanisms for cellular 'hot spots' using existing street cabinets.

FIG. 7 shows an illustration of the exemplary cylindrically bended patch antenna 630 showing an exemplary shape, dimensions and connections. For example, the cylindrically bended patch antenna 630 can include two antennas elements 731 and 732 separated from each other at a distance corresponding to an electrical distance of $\lambda/2$. In some embodiments, the cylindrically bended patch antenna 630 can be configured in a housing structure 710. For example, the housing structure 710 can be attached on top of the end of the pole 610, e.g., extending the overall length of the device by residing above the pole. Also, for example, the housing structure 710 can be attached at the side of the pole 610. In the example shown in FIG. 7, the housing structure 710 is structured as a cylindrical body with a hollow interior to facilitate the feeder cable 610 to electrically connect to the antenna 630 components. In this example, the housing structure 710 can be configured with a circumference corresponding to an electrical distance of $\lambda$. The antenna element 731 includes two antenna sub-elements 731a and 731b. The antenna element 732 includes two antenna sub-elements 732a and 732b. For example, the length of the exemplary antenna elements 731 and 732 are configured at a length corresponding to an electrical distance of $\lambda$. The exemplary cylindrically bended patch antenna 630 can be connected to the RRU/BU 650 of the device 600 using two feeder cables 620, e.g., in which a feeder cable 721 electrically connects the RRU/BU 650 to the antenna element 731 and the feeder cable 722 electrically connects the RRU/BU 650 to the antenna element 732. For example, more antenna elements could be located along the pole to provide advance techniques such as MIMO N×N or beamforming, without adding any noticeable visual impact.

Figure 8:
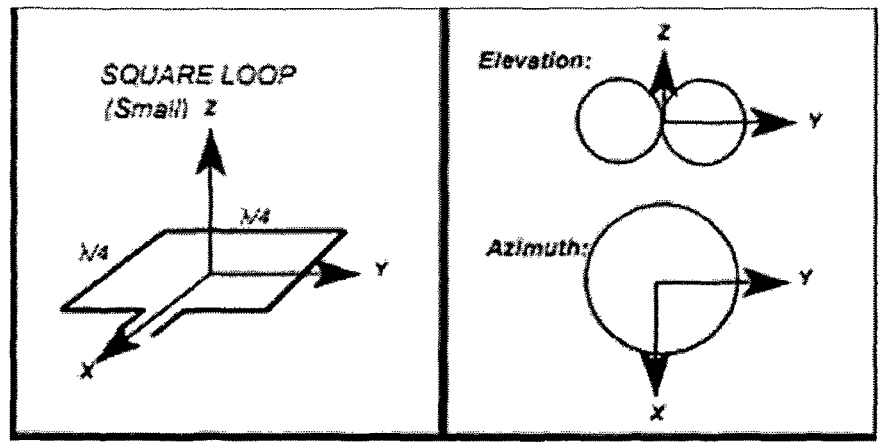
FIG. 8 shows an illustration of the radiation pattern for a square loop antenna.

FIG. 8 shows an illustration of the radiation pattern for a square loop antenna. The case for circular loop antenna can be the same for an overall ring perimeter of $\lambda$. For example, as a reference, $\lambda$ for 1.8 GHz is 15 cm (pole radius=2.4 cm), $\lambda$, for 3.5 GHz is 7.7 cm (pole radius=1.2 cm), which can secure a reduced structure size and visual impact.

Figure 9:
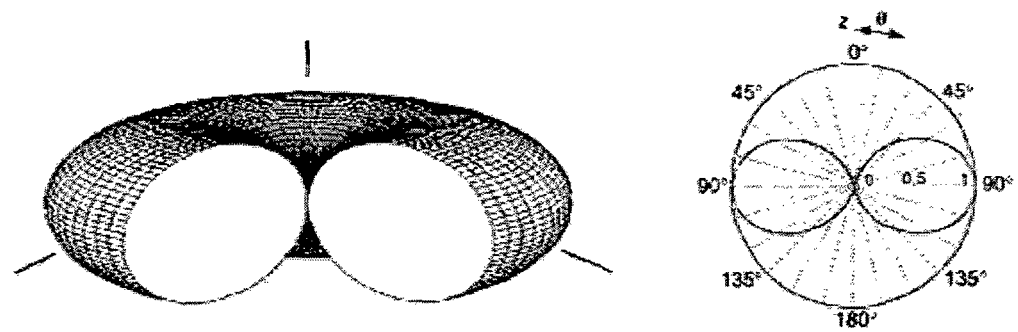
FIG. 9 shows an illustration of the radiation pattern for a conventional dipole.

FIG. 9 shows an illustration of the radiation pattern for a conventional dipole.

Figure 10:
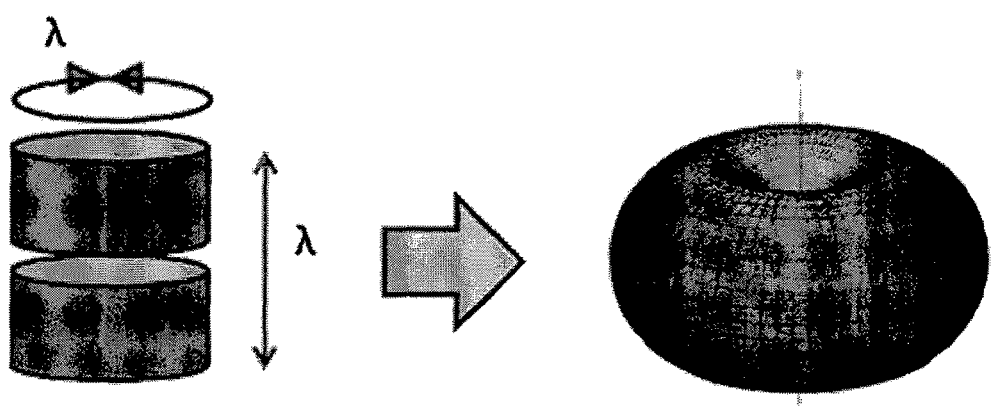
FIG. 10 shows an illustration of the overall radiation pattern for an exemplary cylindrically bent patch.

FIG. 10 shows an illustration of the overall radiation pattern for an exemplary cylindrically bent patch.

For example, all or most of the aforementioned drawbacks posed from the deployment of small cells are immediately solved through the utilization of the street cabinets (e.g., including existing street cabinets) to provide the location of the described active equipment within the exemplary device structure/enclosure. Exemplary advantages and features enabled by implementation of the disclosed small cell wireless devices in street cabinets may include, but are not limited to, (a) lack of requirement for site acquisition (e.g., as the site already exists and arrangement is in place, there is no additional extra fee for introducing new equipment within the mini shelter); (b) lack of requirement for implementation permits (e.g., as the site already exists and arrangement is in place, there is no further permit required for introducing new equipment within the mini shelter); (c) no negative environmental impact effects; (d) reuse of the existing energy supply and back up mechanisms; and (e) in the case of the exemplary small cell wireless devices in street cabinets used for Fixed Access equipment, the node is already passed with high capacity fiber.

In another aspect, the disclosed technology includes a method for providing a small cell base station device in an existing street cabinet. In some embodiments, the method includes a process to locate an existing street cabinet including equipment utilizing electrical power. The method includes a process to install a small cell base station device into the existing street cabinet. For example, the process to install the small cell base station device, e.g., such as the device 600, can include including attaching a mast of the device (e.g., such as the pole 610) to the exterior of the street cabinet (e.g., such as street cabinet 601), such that an antenna (e.g., such as the antenna 630) of the device attached to the mast is raised to a height above the top surface of the street cabinet unit. For example, the process to install the small cell base station device can include connecting the device to an electrical power connection in the street cabinet. The method includes a process to provide electrical power to the device to enable the device to operate.

Implementations of the subject matter and the functional operations described in this patent document can be implemented in various systems, digital electronic circuitry, or in computer software, firmware, or hardware, including the structures disclosed in this specification and their structural equivalents, or in combinations of one or more of them. Implementations of the subject matter described in this specification can be implemented as one or more computer program products, i.e., one or more modules of computer program instructions encoded on a tangible and non-transitory computer readable medium for execution by, or to control the operation of, data processing apparatus. The computer readable medium can be a machine-readable storage device, a machine-readable storage substrate, a memory device, a composition of matter effecting a machine-readable propagated signal, or a combination of one or more of them. The term "data processing apparatus" encompasses all apparatus, devices, and machines for processing data, including by way of example a programmable processor, a computer, or multiple processors or computers. The apparatus can include, in addition to hardware, code that creates an execution environment for the computer program in question, e.g., code that constitutes processor firmware, a protocol stack, a database management system, an operating system, or a combination of one or more of them.

A computer program (also known as a program, software, software application, script, or code) can be written in any form of programming language, including compiled or interpreted languages, and it can be deployed in any form, including as a stand-alone program or as a module, component, subroutine, or other unit suitable for use in a computing environment. A computer program does not necessarily correspond to a file in a file system. A program can be stored in a portion of a file that holds other programs or data (e.g., one or more scripts stored in a markup language document), in a single file dedicated to the program in question, or in multiple coordinated files (e.g., files that store one or more modules, sub programs, or portions of code). A computer program can be deployed to be executed on one computer or on multiple computers that are located at one site or distributed across multiple sites and interconnected by a communication network.

The processes and logic flows described in this specification can be performed by one or more programmable processors executing one or more computer programs to perform functions by operating on input data and generating output. The processes and logic flows can also be performed by, and apparatus can also be implemented as, special purpose logic circuitry, e.g., an FPGA (field programmable gate array) or an ASIC (application specific integrated circuit).

Processors suitable for the execution of a computer program include, by way of example, both general and special purpose microprocessors, and any one or more processors of any kind of digital computer. Generally, a processor will receive instructions and data from a read only memory or a random access memory or both. The essential elements of a computer are a processor for performing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices. Computer readable media suitable for storing computer program instructions and data include all forms of nonvolatile memory, media and memory devices, including by way of example semiconductor memory devices, e.g., EPROM, EEPROM, and flash memory devices. The processor and the memory can be supplemented by, or incorporated in, special purpose logic circuitry.

While this patent document contains many specifics, these should not be construed as limitations on the scope of any invention or of what may be claimed, but rather as descriptions of features that may be specific to particular embodiments of particular inventions. Certain features that are described in this patent document in the context of separate embodiments can also be implemented in combination in a single embodiment. Conversely, various features that are described in the context of a single embodiment can also be implemented in multiple embodiments separately or in any suitable subcombination. Moreover, although features may be described above as acting in certain combinations and even initially claimed as such, one or more features from a claimed combination can in some cases be excised from the combination, and the claimed combination may be directed to a subcombination or variation of a subcombination.

Similarly, while operations are depicted in the drawings in a particular order, this should not be understood as requiring that such operations be performed in the particular order shown or in sequential order, or that all illustrated operations be performed, to achieve desirable results. Moreover, the separation of various system components in the embodiments described in this patent document should not be understood as requiring such separation in all embodiments.

Only a few implementations and examples are described and other implementations, enhancements and variations can be made based on what is described and illustrated in this patent document.

What is claimed are techniques and structures as described and shown, including:

1. A cell base station device for wireless communication, the device comprising:
    a street cabinet unit including an enclosure;
    a radio unit, configured to operate in a frequency range, that resides within the enclosure of the street cabinet unit and configured to generate wireless communication signals;
    a pole attached to the exterior of the street cabinet unit, the pole structured to include an orifice and a diameter in a range between 2.4 cm to 4.8 cm based on the frequency range;
    an antenna attached to the pole such that the antenna is at a height above the top surface of the street cabinet unit and configured to transmit the wireless communication signals to provide wireless service in a range of 10 meters to 200 meters from the cell base station, the antenna configured as a cylindrical patch antenna including multiple antenna elements; and
    a feeder cable that electrically couples the antenna to the radio unit to direct the wireless communication signals from the radio unit to the antenna, the feeder cable at least partially contained within the orifice,
    wherein the cylindrical patch antenna is positioned at the highest end of the pole and the multiple antenna elements are separated with an electrical distance of at least $\lambda/2$ between each other, wherein $\lambda$ represents a corresponding wavelength of the frequency band.

2. The device of claim 1, wherein the pole is a tubular pole.

3. The device of claim 1, wherein the pole includes a length in a range of 3.5 m to 4 m.

4. The device of claim 1, wherein the pole includes a central hollow interior to provide the orifice.

5. The device of claim 1, wherein the pole is attached to the exterior of the street cabinet unit using one or more brackets.

6. The device of claim 5, wherein the feeder cable is run from the orifice of the pole through an opening into the street cabinet unit, the opening located under at least one of the one or more brackets.

7. The device of claim 1, wherein the radio unit operates in the frequency range of 1.8 to 3.5 GHz.

8. The device of claim 1, wherein the multiple antenna elements are arranged to provide multiple-input multiple-output communication.

9. The device of claim 1, wherein the multiple antenna elements are arranged to provide beamforming capabilities.

10. The device of claim 1, wherein a perimeter of the pole is generally same as $\lambda$.

11. A method of providing a small cell base station device in an existing street cabinet, the method comprising:
    locating an existing street cabinet including equipment utilizing electrical power;
    installing a small cell base station device into the existing street cabinet, the installing including attaching a mast of the device to the exterior of the street cabinet such that a cylindrical patch antenna of the device attached to the mast is raised to a height above the top surface of the street cabinet unit and connecting the device to an electrical power connection in the street cabinet, wherein the cylindrical patch antenna is configured to operate in a frequency range and is positioned at the highest end of the mast, wherein the mask is structed to include an orifice and a diameter in a range between 2.4 cm to 4.8 cm based on the frequency range, and wherein the cylindrical patch antenna includes multiple antenna elements that are separated with an electrical distance of at least $\lambda/2$ between each other, $\lambda$ representing a corresponding wavelength of the frequency range; and providing electrical power to the device to enable the device to operate.

12. The method of claim 11, further comprising:

configuring the small cell base station device to transmit and receive in a frequency range between 1.8 to 3.5 GHz.

\* \* \* \* \*